United States Patent
Trindade et al.

(10) Patent No.: US 12,396,101 B2
(45) Date of Patent: Aug. 19, 2025

(54) FLEXIBLE ELECTRONIC STRUCTURES

(71) Applicant: X-Celeprint Limited, Dublin (IE)

(72) Inventors: António José Marques Trindade, Cork (IE); Alexandre Chikhaoui, Kehl (DE); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 265 days.

(21) Appl. No.: 18/143,879

(22) Filed: May 5, 2023

(65) Prior Publication Data
US 2023/0363092 A1    Nov. 9, 2023

Related U.S. Application Data

(60) Provisional application No. 63/339,951, filed on May 9, 2022.

(51) Int. Cl.
| | |
|---|---|
| *H05K 1/14* | (2006.01) |
| *H05K 1/11* | (2006.01) |
| *H05K 1/18* | (2006.01) |
| *H05K 3/30* | (2006.01) |

(52) U.S. Cl.
CPC .......... *H05K 1/145* (2013.01); *H05K 1/113* (2013.01); *H05K 1/189* (2013.01); *H05K 3/306* (2013.01); *H05K 2201/10106* (2013.01)

(58) Field of Classification Search
CPC .......... H05K 1/14; H05K 1/145; H05K 1/113; H05K 1/189; H05K 3/306; H05K 2201/10106
USPC ........................................................ 174/254
See application file for complete search history.

(56) References Cited

U.S. PATENT DOCUMENTS

| | | |
|---|---|---|
| 7,622,367 B1 | 11/2009 | Nuzzo et al. |
| 8,506,867 B2 | 8/2013 | Menard |
| 8,722,458 B2 | 5/2014 | Rogers et al. |
| 8,889,485 B2 | 11/2014 | Bower |
| 9,997,102 B2 | 6/2018 | Rotzoll et al. |
| 10,103,069 B2 | 10/2018 | Bower et al. |

(Continued)

OTHER PUBLICATIONS

Cok, R. S. et al., Inorganic light-emitting diode displays using micro-transfer printing, Journal of the SID, 25(10):589-609, (2017).

*Primary Examiner* — Tremesha W Burns
(74) *Attorney, Agent, or Firm* — Choate, Hall & Stewart LLP; Michael D. Schmitt

(57) ABSTRACT

A flexible electronic structure includes a flexible substrate comprising an electrically conductive top substrate layer and an opposing electrically conductive bottom substrate layer and a component. The component can include a component substrate non-native to the flexible substrate having a component substrate top side and an opposing component substrate bottom side, a planar component top electrode disposed on the component substrate top side and electrically connected to the electrically conductive top substrate layer thereby defining a planar electrical contact, and a planar component bottom electrode disposed on the component substrate bottom side and electrically connected to the electrically conductive bottom substrate layer thereby defining a planar electrical contact. The component can be disposed between the electrically conductive top substrate layer and the electrically conductive bottom substrate layer.

19 Claims, 12 Drawing Sheets

(56) References Cited

U.S. PATENT DOCUMENTS

| | | |
|---|---|---|
| 10,153,256 B2 | 12/2018 | Cok et al. |
| 10,198,890 B2 | 2/2019 | Rotzoll et al. |
| 10,200,013 B2 | 2/2019 | Bower et al. |
| 10,224,460 B2 | 3/2019 | Bower et al. |
| 10,468,363 B2 | 11/2019 | Prevatte et al. |
| 2016/0093600 A1 | 3/2016 | Bower et al. |
| 2024/0176940 A1* | 5/2024 | Ito .................. G06F 30/398 |

* cited by examiner

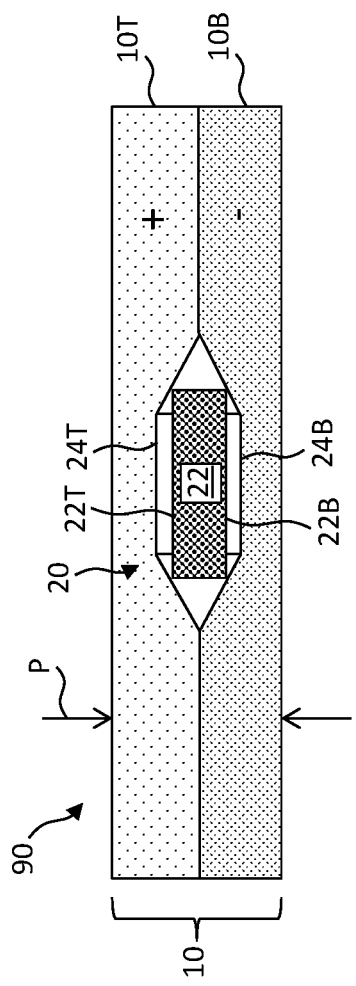
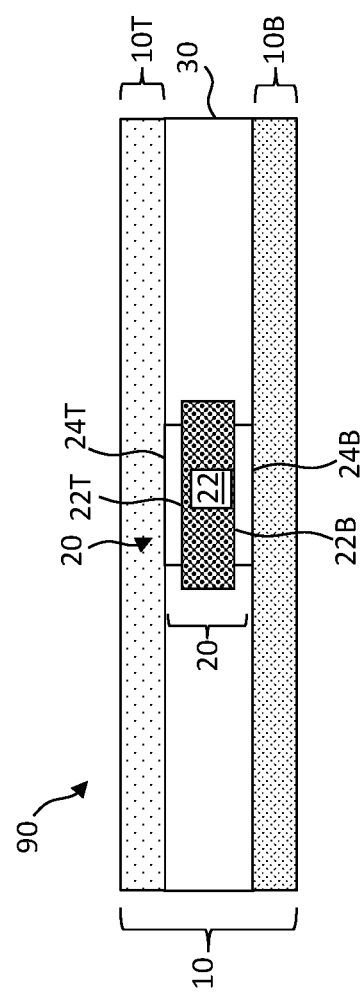

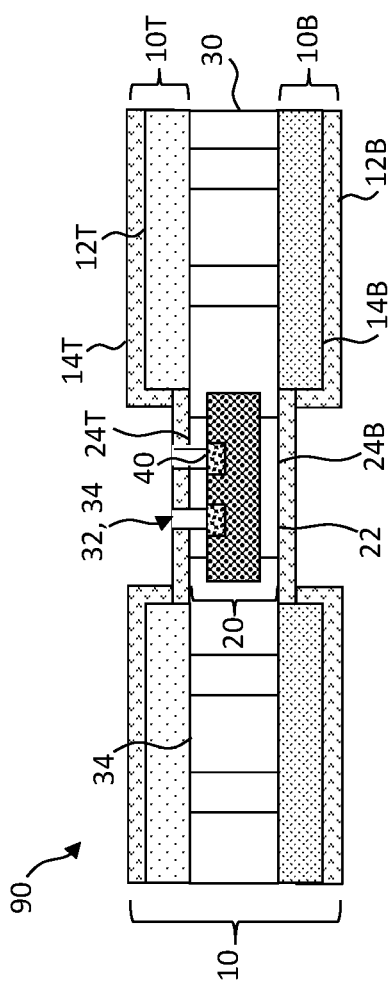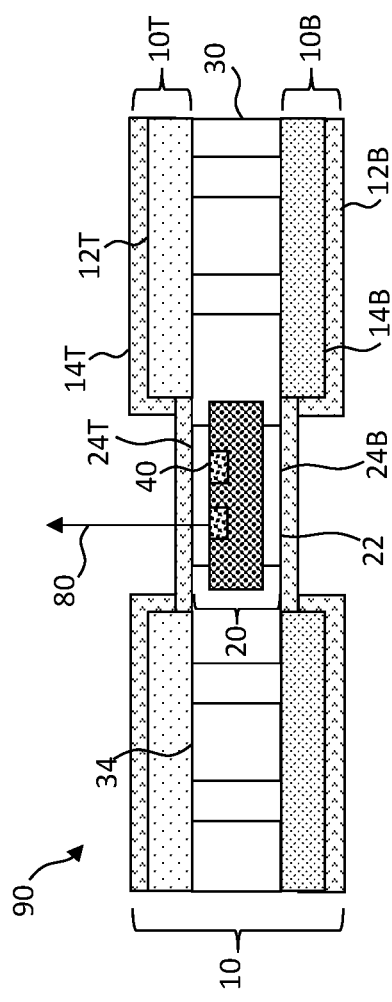
FIG. 5B
FIG. 5C

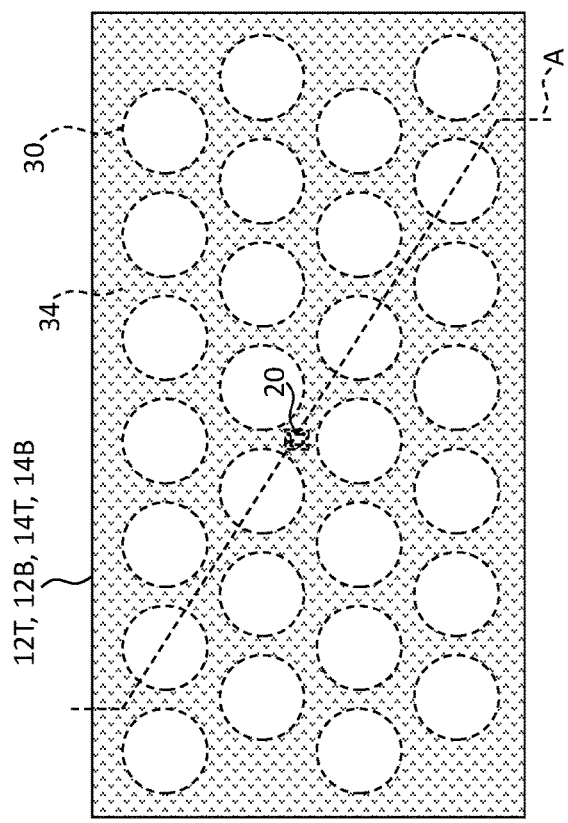
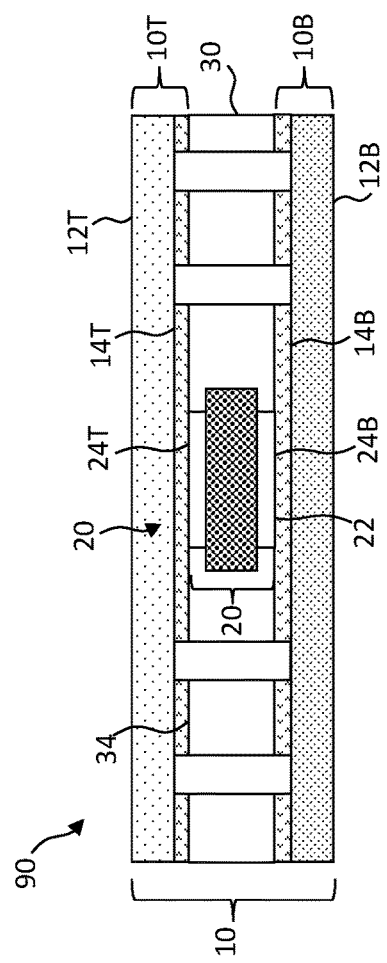
FIG. 6A
FIG. 6B

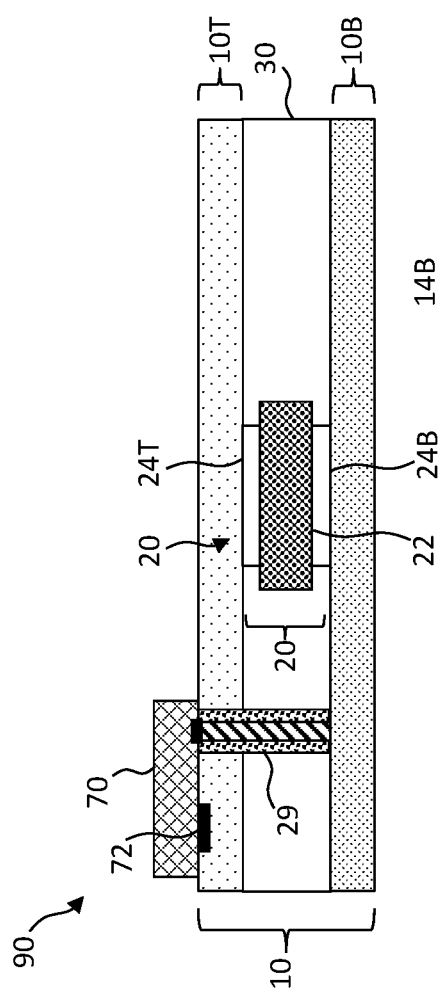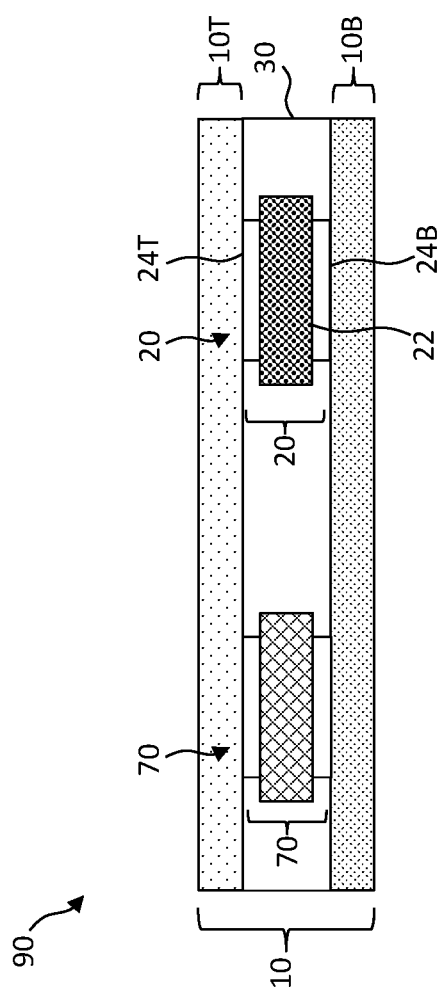
FIG. 11A
FIG. 11B

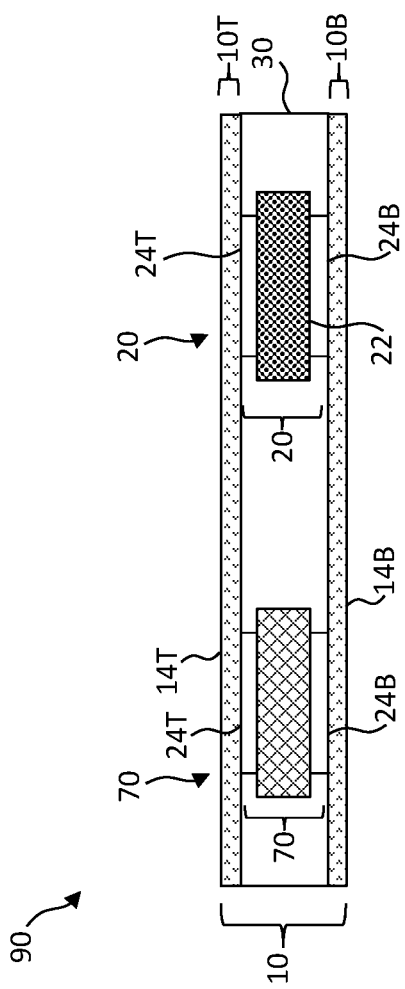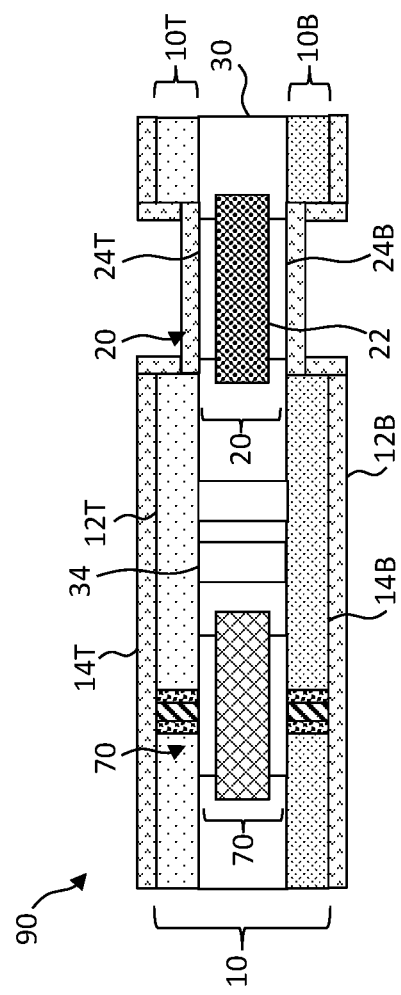

FLEXIBLE ELECTRONIC STRUCTURES

PRIORITY APPLICATION

The present application claims the benefit of U.S. Provisional Patent Application No. 63/339,951, filed on May 9, 2022, the disclosure of which is hereby incorporated by reference in its entirety.

TECHNICAL FIELD

The present disclosure relates generally to flexible electronic structures comprising integrated circuits on a flexible substrate.

BACKGROUND

Flexible electronic systems are useful for a variety of applications in which the electronic system is integrated into flexible materials or structures, such as clothing, paper, bandages, including wearable and some medical devices. Integrated circuits can be disposed on flexible substrates, for example polymer substrates. Flexible printable circuits can be a part of flexible electronics in which electronic components are mounted on a flexible substrate and electrically connected with wires formed on the flexible substrate. Flexible substrates can include polyethylene naphthalate, polyethylene terephthalate, polyimide, polyether ether ketone, or generally polyester films or flexible glass.

Some flexible electronic systems include active electronic components, such as transistors. The transistors can be made in relatively rigid crystalline semiconductor materials mounted on and non-native to a flexible substrate or can themselves be relatively flexible and formed on and native to the flexible substrate, for example organic electronics.

Flexible electronic systems can be subject to extreme mechanical stress as the flexible substrate is flexed. Wires formed on the flexible substrate can crack as can electrical connections between wires on the flexible substrate and any relatively rigid electronic materials, such as relatively rigid crystalline semiconductor materials. In particular, the joint between a wire on a flexible substrate and any rigid structure is subject to exception mechanical stress as the flexible substrate is flexed.

There remains a need, therefore, for mechanically robust systems, devices, circuits, and structures in flexible systems.

SUMMARY

The present disclosure provides, inter alia, mechanically robust systems, devices, circuits, and structures useful in flexible systems.

According to embodiments of the present disclosure, a flexible electronic structure comprises a flexible substrate comprising an electrically conductive top substrate layer and an opposing electrically conductive bottom substrate layer and a component. The component can comprise a component substrate non-native to (e.g., separate and independent from) the flexible substrate having a component substrate top side and an opposing component substrate bottom side, a planar component top electrode disposed on the component substrate top side and electrically connected to the electrically conductive top substrate layer thereby defining a planar electrical contact, and a planar component bottom electrode disposed on the component substrate bottom side and electrically connected to the electrically conductive bottom substrate layer thereby defining a planar electrical contact. The component can be disposed between (e.g., at least partly or entirely between) the electrically conductive top substrate layer and the electrically conductive bottom substrate layer. The flexible substrate can be a power-generating substrate and the electrically conductive top substrate layer, and the electrically conductive bottom substrate layer can be or comprise triboelectric layers. In some embodiments, the electrically conductive top substrate layer and the electrically conductive bottom substrate layer are a triboelectric power-generating pair.

In some embodiments, the electrically conductive top substrate layer comprises an electrically conductive top substrate conductive layer and a top substrate power-generating layer. The top substrate conductive layer can be on a side of the top substrate power-generating layer opposite the component. The top substrate power-generating layer is on a side of the top substrate conductive layer opposite the component. In some embodiments, the electrically conductive bottom substrate layer comprises an electrically conductive bottom substrate conductive layer and a bottom substrate power-generating layer. The bottom substrate conductive layer can be on a side of the bottom substrate power-generating layer opposite the component. The bottom substrate power-generating layer can be on a side of the bottom substrate conductive layer opposite the component.

In some embodiments, the flexible substrate comprises a spacer between the electrically conductive top substrate layer and the electrically conductive bottom substrate layer. The spacer can comprise holes where no spacer material is present.

According to some embodiments, the component is relatively rigid compared to the flexible substrate. The component substrate can comprise a crystalline semiconductor substrate.

In some embodiments, the component has a thickness no greater than one hundred microns (e.g., no greater than fifty microns, no greater than twenty microns, no greater than ten microns, no greater than five microns, or no greater than two microns). An area of the component top electrode can have an area that is no less than 50% (e.g., no less than 60%, no less than 70%, no less than 80%, no less than 90% or no less than 100%) of an area of the component substrate top side. In some embodiments, an area of the component bottom electrode has an area that is no less than 50% (e.g., no less than 60%, no less than 70%, no less than 80%, no less than 90% or no less than 100%) of an area of the component substrate bottom side.

The component can be an electronic or optoelectronic component and can comprise a light-emitting diode. The light-emitting diode can comprise at least a portion of a broken or separated LED tether as a consequence of microtransfer printing.

In some embodiments, the electrically conductive top substrate layer is transparent or comprises transparent openings through which the light-emitting diode can emit light or wherein the electrically conductive bottom substrate layer is transparent or comprises openings through which the light-emitting diode can emit light.

According to embodiments of the present disclosure, the flexible electronic structure comprises a plurality of components disposed between (e.g., at least partly or entirely between) the electrically conductive top substrate layer and the electrically conductive bottom substrate layer and wherein the components are electrically connected in parallel. The flexible electronic structure can be a banknote, can be comprised in a portion of a banknote, or can be laminated on a banknote. The component can comprise at least a portion of a broken or separated component tether.

Some embodiments of the present disclosure comprise a power generator electrically connected to the electrically conductive top substrate layer and the electrically conductive bottom substrate layer. The power generator can be disposed on the electrically conductive top substrate layer or on the electrically conductive bottom substrate layer. The power generator can be disposed between (e.g., at least partly or entirely between) the electrically conductive top substrate layer and the electrically conductive bottom substrate layer and is electrically connected to the electrically conductive top substrate layer and to the electrically conductive bottom substrate layer defining planar electrical contacts.

Some embodiments of the present disclosure comprise multiple components electrically connected in parallel, multiple power generators electrically connected in parallel, or both. The multiple components or the multiple power generators can be electrically connected in parallel to the electrically conductive top substrate layer and the electrically conductive bottom substrate layer.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1 is a cross section of a flexible electronic structure comprising a component and a flexible substrate according to illustrative embodiments of the present disclosure;

FIG. 2 is a cross section of a flexible electronic comprising a component and a flexible substrate with a spacer according to illustrative embodiments of the present disclosure;

FIG. 5B is a cross section of a flexible electronic structure comprising a component with light-emitting diodes (LEDs) and a flexible substrate with a spacer and opaque component electrodes with holes through which LEDs can emit light according to illustrative embodiments of the present disclosure;

FIG. 5C is a cross section of a flexible electronic structure comprising a component with light-emitting diodes (LEDs) and a flexible substrate with a spacer and transparent electrodes through which the LEDs can emit light according to illustrative embodiments of the present disclosure;

FIG. 6A is a plan view of a flexible electronic structure comprising a component and a flexible substrate with a spacer having holes and electrically conductive layers adjacent to the spacer according to illustrative embodiments of the present disclosure;

FIG. 6B is a cross section of a flexible electronic structure comprising a component and a flexible substrate with a spacer having holes and electrically conductive layers adjacent to the spacer taken across cross section line A of FIG. 6A according to illustrative embodiments of the present disclosure;

FIG. 11A is a cross section of a flexible electronic structure with a power generator disposed on a flexible substrate according to illustrative embodiments of the present disclosure;

FIG. 11B is a cross section of a flexible electronic structure with a power generator disposed between electrically conductive top substrate layer and electrically conductive bottom substrate layer according to illustrative embodiments of the present disclosure;

FIG. 12A is a cross section of a flexible electrical structure comprising a power generator and a component with top and bottom substrate conductor layers;

FIG. 12B is a cross section of a flexible electrical structure comprising a power generator and a component with top and bottom substrate conductor layers and top and bottom power-generating layers.

Figure 3A:
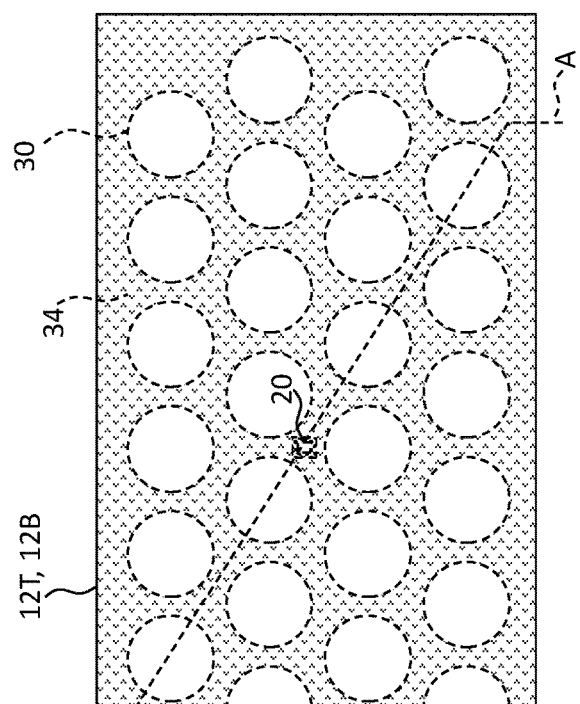
FIG. 3A is a plan view of a flexible electronic structure comprising a component and a flexible substrate with a spacer having holes according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale. The vertical scale of the Figures can be exaggerated to clarify the illustrated structures.

DETAILED DESCRIPTION OF CERTAIN EMBODIMENTS

Embodiments of the present disclosure provide mechanically robust flexible electronic and optoelectronic structures, systems, devices, and circuits useful in flexible electronic systems and applications. Some embodiments are useful in authenticating secure documents, such as banknotes, passports, other secure government documents, labels, and private financial instruments such as paper certificates, bond notes, and the like.

According to some embodiments of the present disclosure and as illustrated in FIG. 1, a flexible electronic structure 90 comprises a flexible substrate 10 comprising an electrically conductive top substrate layer 10T on a top side of flexible substrate 10 and an opposing electrically conductive bottom substrate layer 10B on a bottom side of flexible substrate 10. A component 20 has a component substrate 22 non-native to (e.g., separate and independent from) flexible substrate 10 having a component substrate top side 22T and an opposing component substrate bottom side 22B. A component top electrode 24T is disposed on component substrate top side 22T and electrically connected to electrically conductive top substrate layer 10T to define a planar electrical contact (a planar contact between two surfaces providing an electrical connection). A component bottom electrode 24B is disposed on component substrate bottom side 22B and electrically connected to electrically conductive bottom substrate layer 10B to define a planar electrical contact. Component 20 is disposed between (e.g., at least partly or entirely between) electrically conductive top substrate layer 10T and electrically conductive bottom substrate layer 10B, for example on electrically conductive bottom substrate layer 10B and under electrically conductive top substrate layer 10T. Component 20 can be disposed on electrically conductive bottom substrate layer 10B, for example by printing (e.g., by disposing with a pick-and-place tool or by micro-transfer printing), and electrically conductive top substrate layer 10T can be laminated on component 20 and electrically conductive bottom substrate layer 10B.

In some embodiments, printed flexible electronic structure 90 is a banknote, can be comprised in a portion of a banknote, or is disposed on a banknote, for example laminated on a banknote. Printed flexible electronic structure 90 can be comprised in a secure document, such as a passport or other secure government document, a label, or a private financial instrument such as a paper certificate, bond note, and the like.

In general, for clarity in the Figures the vertical axis is greatly exaggerated with respect to the horizontal axis. For example, flexible substrate 10 can have dimensions of 20 cm in length and 12 cm in width and component 20 can have a length or width of a millimeter or less. Similarly, flexible substrate 10 can have a thickness of one hundred microns and component 20 can have a thickness no greater than fifty, twenty, ten, for five microns.

Component substrate 22 can be an integrated circuit such as a silicon circuit and can comprise electronic circuitry. Component 20 can comprise a light-emitting diode disposed on component substrate 22 and controlled by the silicon circuit and can be relatively rigid compared to flexible substrate 10. Circuits in component substrate 22 can be electrically connected to component top electrode 24T and to component bottom electrode 24B. In some embodiments, a light-emitting diode (LED) disposed on component substrate 22 can be electrically connected to component top electrode 24T and to component bottom electrode 24B either directly or through a circuit. The electronic circuitry can cause the LED to emit light, thereby demonstrating that the printed flexible device is genuine. In some embodiments, component substrate 22 is a semiconductor substrate, e.g., a crystalline semiconductor wafer or substrate; in some embodiments component substrate 22 is a dielectric substrate such as glass, for example flexible glass (that can be less flexible than flexible substrate 10), a polymer such as polyimide (that can be less flexible than flexible substrate 10), or a rigid substrate such as silicon dioxide or silicon nitride. Flexible substrate 10 can comprise any combination of cloth, paper, cardboard, or polymers, for example polymer-coated or infused paper or cloth. Embodiments of the disclosure are not limited by specific materials in flexible substrate 10 or component 20.

A planar electrical contact is an electrical contact that extends over an area between two electrically conductive surfaces, for example between electrically conductive top substrate layer 10T and component top electrode 24T or between electrically conductive bottom substrate layer 10B and component bottom electrode 24B. Most conventional electrical contacts are substantially one-dimensional wires that are edge contacts extending from or over a single edge or single side of an integrated circuit, for example from an integrated circuit to an electrical substrate such as a printed circuit board. A substantially one-dimensional wire has a length that is much greater than its width, thickness, or cross section, for example having a width that is a few microns and an aspect ratio of width to length that is no less than ten, twenty, fifty, one hundred, five hundred, or one thousand. In contrast, a planar or area electrical contact on a substrate surface extends up to or is adjacent to all sides or edges of component substrate top side 22T or component substrate bottom side 22B of component substrate 22. The planar or area electrical contact can be substantially two dimensional and has a thickness that is much less than its length and a thickness that is much less than its width. In some embodiments, a planar contact has a thickness no greater than five, two, or one micron and an aspect ratio of length to width of substantially one, or no greater than ten, no greater than five, no greater than two, or no greater than 1.5, or no greater than one. A planar contact can extend over substantially all of component substrate top side 22T or component substrate bottom side 22B, or extend over no less than 30%, (e.g., no less than 90%, 80%, 70%, 60%, 50%, or 40%) of component substrate top side 22T or component substrate bottom side 22B. Accordingly and in some embodiments of the present disclosure, component top and bottom electrodes 24T, 24B do not extend over a side or edge of component substrate 22 and electrically conductive top and bottom substrate layers 10T, 10B extend over more than one side or edge of component substrate 22, for example two sides or edges of component substrate 22, three sides or edges of component substrate 22, four sides or edges of component substrate 22, or all sides of or edges of component substrate 22. Component top and bottom electrodes 24T, 24B can be portions of conductive planes as can electrically conductive top and bottom substrate layers 10T, 10B when flexible substrate 10 is not flexed. A planar electrical contact can have a length or width no less than ten μm (e.g., a length or width no less than twenty μm, a length or width no less than fifty μm, a length or width no less than one hundred μm, a length or width no less than two hundred μm, or a length or width no less than five hundred μm). A planar electrical contact can have an area that is no less than ten μm by ten μm or that is no less than one hundred μm$^2$ (e.g., no less than twenty μm by twenty μm or that is no less than four hundred μm$^2$, no less than fifty µm by fifty µm or that is no less than 2500 µm$^2$, no less than one hundred µm by one hundred µm or that is no less than ten thousand µm$^2$), no less than two hundred µm by two hundred µm or that is no less than forty thousand µm$^2$, no less than five hundred µm by five hundred µm or that is no less than 250,000 µm$^2$, or no less than one mm by one mm or that is no less than one mm$^2$).

Component top and bottom electrodes 24T, 24B can be electrically conductive films disposed on component substrate 22, for example a metal film (e.g., aluminum, gold, silver, tin, copper, or other metals or metal alloys), a conductive oxide, or an electrically conductive polymer film, for example polythiophene. In some embodiments, one or both of component top and bottom electrodes 24T, 24B is transparent, for example transmitting 50%, 60%, 70%, 80%, 90%, or 95% or more of incident visible light. In some embodiments, one or both of component top and bottom electrodes 24T, 24B is opaque for example transmitting less than 50%, 40%, 30%, 20%, 100%, or 5% of incident visible light. Where one or both component top or bottom electrodes 24T, 24B is opaque, it can comprise holes 34 (e.g., transparent openings) through which light is transmitted or a transparent fill 32 material, such as a resin or epoxy. Despite the presence of holes 34 through component top or bottom electrodes 24T, 24B, component top or bottom electrodes 24T, 24B can be contiguous so that an electrical charge supplied to any portion of component top or bottom electrodes 24T, 24B can flow to any or every other portion of component top or bottom electrodes 24T, 24B.

In operation, electrical power is generated either with flexible substrate 10 or a structure disposed on or in flexible substrate 10. The electrical power is electrically conducted through electrically conductive top substrate layer 10T and electrically conductive bottom substrate layer 10B. Electrically conductive top substrate layer 10T and electrically conductive bottom substrate layer 10B can be or comprise electrodes (e.g., positive and negative electrodes) that conduct electrical current to component 20. Component 20 responds to the conducted electrical current to operate, for example component 20 can comprise one or more light-emitting diodes that emit light in response to the electrical current conducted by electrically conductive top substrate layer 10T through a top planar electrical contact defined by component top electrode 24T, to component 20, and then through a bottom planar electrical contact defined by component bottom electrode 24B to electrically conductive bottom substrate layer 10B to complete the circuit. Alternatively, electrical current can be conducted in the opposite direction.

As illustrated in FIG. 1, component 20 is disposed between electrically conductive top and bottom substrate layers 10T and 10B (also referred to as top and bottom substrate layers 10T and 10B), for example by disposing component 20 onto electrically conductive bottom substrate layer 10B and laminating electrically conductive top substrate layer 10T onto electrically conductive bottom substrate layer 10B and component 20. In some embodiments and as shown in FIG. 2, flexible substrate 10 comprises a spacer 30 (e.g., a spacing layer) disposed between top and bottom substrate layers 10T, 10B to separate top substrate layer 10T from bottom substrate layer 10B. Component 20 can be disposed on or in spacer 30. Spacer 30 can be a flexible polymer but cannot prevent component top electrode 24T from electrically contacting top substrate layer 10T and component bottom electrode 24B from electrically contacting bottom substrate layer 10B. Such a spacer 30 can provide a flatter and more appealing surface to flexible electronic circuit 90. Spacer 30 can be a polymer or paper layer having a thickness the same as or comparable to a thickness of component 20.

In some embodiments of the present disclosure, flexible substrate 10 can be a power-generating substrate, for example top substrate layer 10T and bottom substrate layer 10B are or comprise triboelectric layers comprising triboelectric materials such as polymers such as PTFE, FEP, PDMS, and Kapton with or without additives that are responsive to pressing, pinching, or any form of mechanical pressure or motion to separate charge on each of the triboelectric layers. Thus, top substrate layer 10T can comprise different materials from bottom substrate layer 10B, e.g., top substrate layer 10T and bottom substrate layer 10B can comprise positive and negative triboelectric materials, respectively, or vice versa. Such polymer triboelectric materials can be elastic materials that regain their shape after compression from mechanical pressure so that they can repeatedly separate charges in response to the mechanical pressure.

Figure 3B:
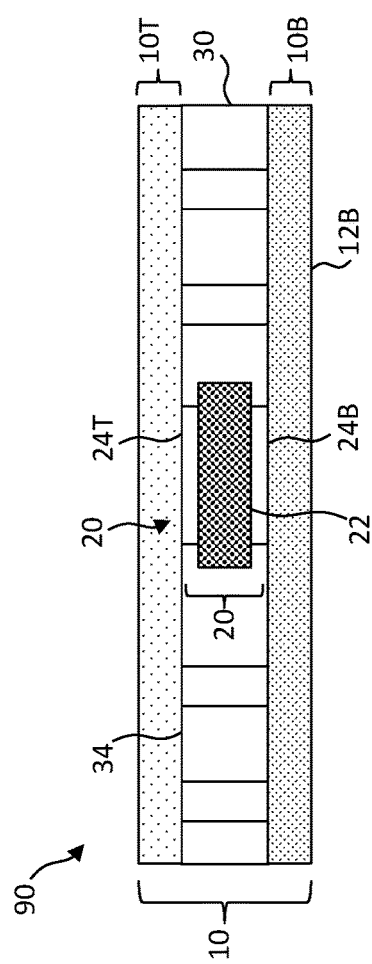
FIG. 3B is a cross section of a flexible electronic structure comprising a component and a flexible substrate with a spacer having holes taken across cross section line A of FIG. 3A according to illustrative embodiments of the present disclosure.

In some embodiments of the present disclosure, spacer 30 can prevent or inhibit top substrate layer 10T and bottom substrate layer 10B from contacting or sliding along each other, diminishing the tribo-electric effect between top and bottom substrate layers 10T, 10B. To overcome or mitigate any such inhibition, spacer 30 can comprise holes 34 so that top substrate layer 10T and bottom substrate layer 10B can touch or closely approach each other through holes 34, as shown in FIGS. 3A and 3B. As shown in the plan view of FIG. 3A and the corresponding cross section across cross section line A of FIG. 3A shown in FIG. 3B, holes 34 are shown as relatively small, but in practice, a significant percentage of the area of spacer 30 (e.g., a majority of the area) can comprise holes 34 so that top substrate layer 10T and bottom substrate layer 10B can contact ample, adequate, and significant area responsive to mechanical pressure or motion to separate charges in the tribo-electric layers. (FIGS. 3A and 3B are not relatively to scale.)

Figure 4A:
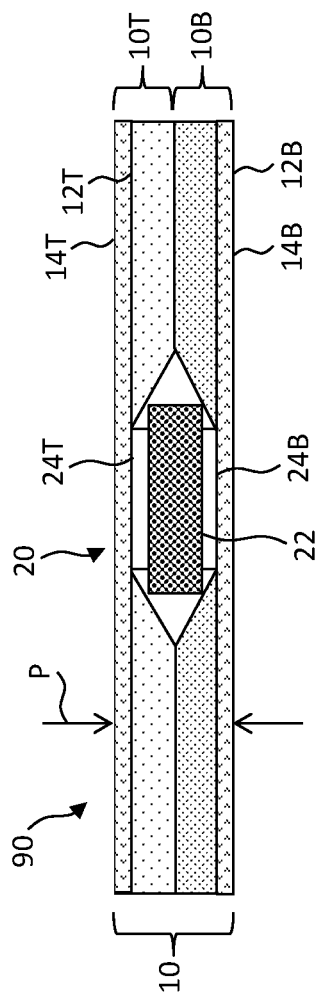
FIG. 4A is a cross section of a flexible electronic structure comprising a component and a flexible substrate with electrically conductive and power-generating layers according to illustrative embodiments of the present disclosure.
Figure 4B:
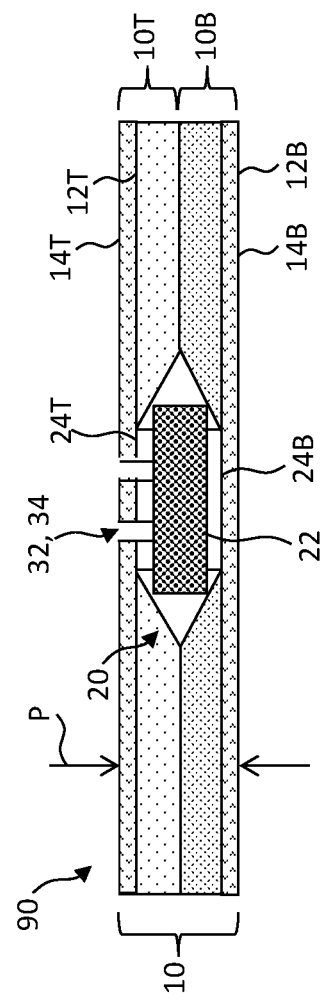
FIG. 4B is a cross section of a flexible electronic structure comprising a component and a flexible substrate with opaque electrically conductive layers with holes and power-generating layers according to illustrative embodiments of the present disclosure.

In some embodiments, the triboelectric materials are less electrically conductive than can be desired so that each of top substrate layer 10T and bottom substrate layer 10B can comprise multiple layers or sub-layers to facilitate charge conduction from an area of pressure or relative motion on flexible substrate 10 to component 20. In some embodiments and as shown in FIGS. 4A and 4B, top substrate layer 10T comprises an electrically conductive top substrate conductor layer 14T and a top substrate power-generating layer 12T. Similarly, bottom substrate layer 10B comprises an electrically conductive bottom substrate conductor layer 14B and a bottom substrate power-generating layer 12B. Top and bottom substrate power-generating layers 12T, 12B together separate charges in response to mechanical pressure or motion and the separated charges are electrically conducted by the top and bottom substrate conductor layer 14T, 14B, respectively, through the planar contacts defined by component top and bottom electrodes 24T, 24B and thence to component substrate 22 (integrated circuit 22).

As shown in FIGS. 4A and 4B, top substrate conductor layer 14T is on a side of the top substrate power-generating layer 12T opposite component 20. Pressure P can force top and bottom substrate power-generating layers 12T, 12B together, compressing them to separate charges that are conducted to component 20 with top and bottom substrate conductor layers 14T, 14B.

In some embodiments of the present disclosure and as shown in FIG. 4A, top or bottom substrate conductor layers 14T, 14B and component top or bottom electrodes 24T, 24B can be transparent. In some embodiments of the present disclosure, top or bottom substrate conductor layers 14T, 14B and component top or bottom electrodes 24T, 24B can be opaque. Where the layers are opaque and it is desirable to emit light through at least some of the layers, holes 34 with or without transparent fill 32 can be provided in top or bottom substrate conductor layers 14T, 14B and component top or bottom electrodes 24T, 24B so that light can transmit through the layers, as shown in FIG. 4B. Transparent fill 32 can be, for example a flexible or rigid transparent polymer. Holes 34 in the layers can be aligned and, despite the presence of holes 34, top and bottom substrate conductor layers 14T, 14B and component top and bottom electrodes 24T, 24B can each be electrically contiguous and form a single electrical contact and conductor (e.g., holes 34 do not extend completely from one side of top or bottom substrate conductor layers 14T, 14B or component top or bottom electrodes 24T, 24B to another side.

Figure 5A:
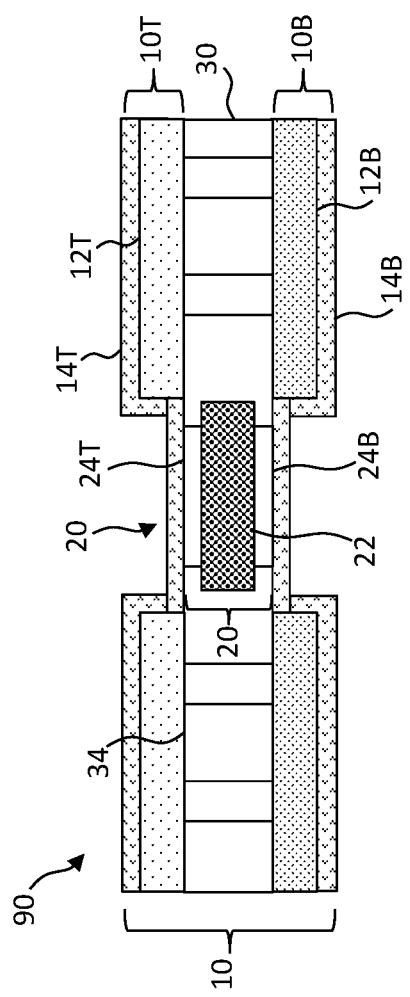
FIG. 5A is a cross section of a flexible electronic structure comprising a component and a flexible substrate with a spacer according to illustrative embodiments of the present disclosure.

As shown in FIGS. 5A-5C, spacer 30 separates top and bottom substrate power-generating layers 12T, 12B. Spacer 30 can comprise holes 34 enabling compression and contact between top and bottom substrate power-generating layers 12T, 12B. Top and bottom substrate power-generating layers 12T, 12B are absent directly above and below component 20 to enable electrical contact between top and bottom substrate conductor layers 14T, 14B and component top and bottom electrodes 24T, 24B, respectively. As shown in FIG. 5A and corresponding to FIG. 4A, top or bottom substrate conductor layers 14T, 14B and component top or bottom electrodes 24T, 24B can be transparent or opaque.

Where the layers are opaque and it is desirable to emit light through at least some of the layers, for example with light-emitting diodes (LEDs) 40, holes 34 with or without transparent fill 32 can be provided in top or bottom substrate conductor layers 14T, 14B and component top or bottom electrodes 24T, 24B so that light can transmit through the layers, as shown in FIG. 5B. As shown in FIG. 5C, component 20 can comprise an LED 40 that receives power from top and bottom substrate layers 10T, 10B to emit light 80 through transparent top or bottom substrate conductor layers 14T, 14B or component top or bottom electrodes 24T, 24B.

More generally, electrically conductive top substrate layer 10T can be transparent or comprise transparent openings (e.g., holes 34) through which light-emitting diode 40 can emit light 80 or the electrically conductive bottom substrate layer 10B is transparent or comprises openings (e.g., holes 34) through which light-emitting diode 40 can emit light 80. Holes 34 in the layers can be aligned and, despite the presence of holes 34, top and bottom substrate conductor layers 14T, 14B and component top and bottom electrodes 24T, 24B can each be electrically contiguous and form a single electrical contact and conductor.

FIGS. 6A and 6B illustrate embodiments in which flexible substrate 10 comprises a spacer 30 between electrically conductive top substrate layer 10T and electrically conductive bottom substrate layer 10B. Top substrate layer 10T comprises a top substrate power-generating layer 12T and top substrate conductive layer 14T. Bottom substrate layer 10B comprises a bottom substrate power-generating layer 12B and bottom substrate conductive layer 14B. Top and bottom substrate conductor layers 14T, 14B are adjacent to spacer 30 and between spacer 30 and top and bottom substrate power-generating layers 12T, 12B, respectively. Holes 34 can be disposed in top and bottom substrate conductor layers 14T, 14B and spacer 30 to enable top and bottom substrate power-generating layers 12T, 12B to generate charges in response to pressure in holes 34 on top and bottom substrate power-generating layers 12T, 12B.

Figure 7:
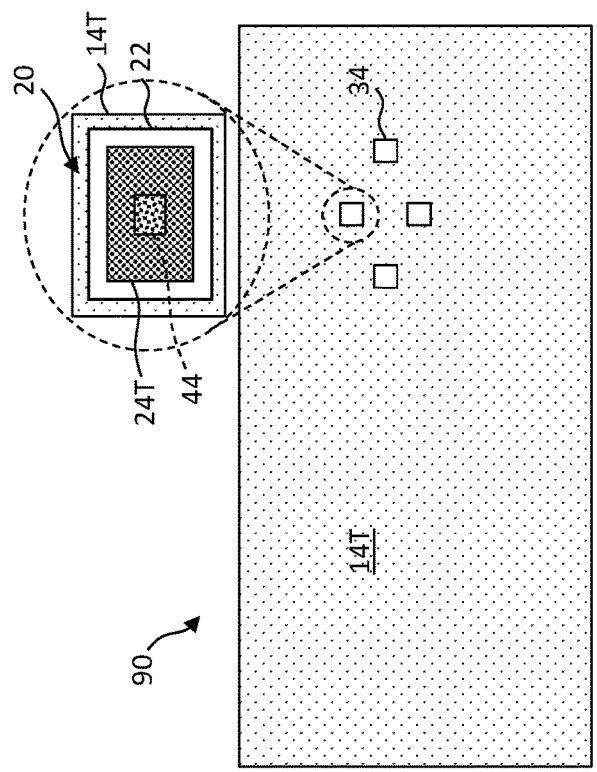
FIG. 7 is a plan view of a flexible electronic structure comprising multiple components and a flexible substrate according to illustrative embodiments of the present disclosure.

FIG. 7 is a plan view of a flexible electronic structure 90 comprising multiple components 20 disposed under corresponding holes 34 or transparent fill 32 in top substrate conductor layer 14T. The detail illustrates a planar electrical contact defined by top substrate conductor layer 14T over component top electrode 24T over LED 40 over component substrate 22. Component top electrode 24T covers most of component substrate 22 and top substrate conductor layer 14T covers all of component substrate 22 and all of component top electrode 24T.

Figure 8:
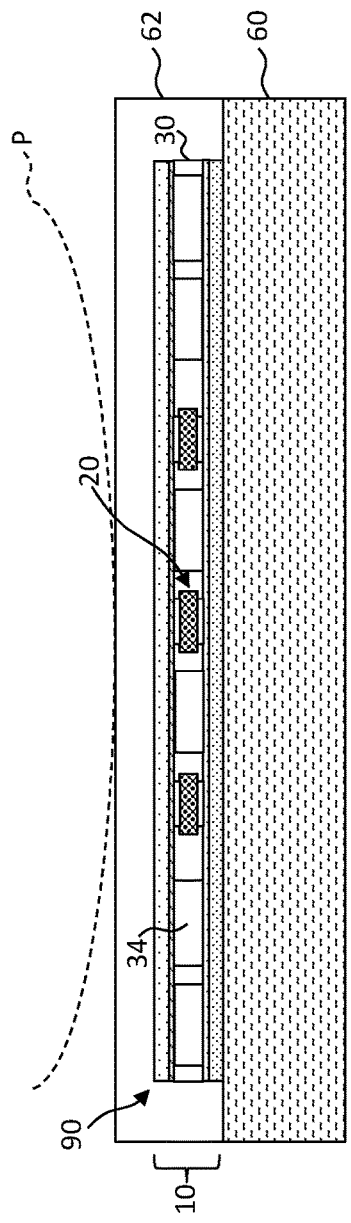
FIG. 8 is a cross section of a flexible electronic structure laminated to a document substrate with a laminated strip under pressure from a finger according to illustrative embodiments of the present disclosure.

FIG. 8 is a cross section illustrating a flexible electronic structure 90 with flexible substrate 10, spacer 30 with holes 34 and multiple components 20 disposed on or a part of a banknote 60 (or other paper or document, for example secure documents such as government documents or financial instruments). Components 20 are effectively electrically connected in parallel and can respond to a common electrical current provided through top and bottom substrate layers 10T, 10B. A laminated strip 62 (for example a transparent polymer strip) can be laminated on or over flexible electronic structure 90 to protect flexible electronic structure 90 from environmental contamination, such as liquids or gases and to provide further mechanical protection. FIG. 8 illustrates a finger providing pressure P on flexible electronic structure 90 to generate charges in flexible substrate 10 that are electrically conducted to electronically operate component 20, for example to emit light from component 20.

Figure 9:
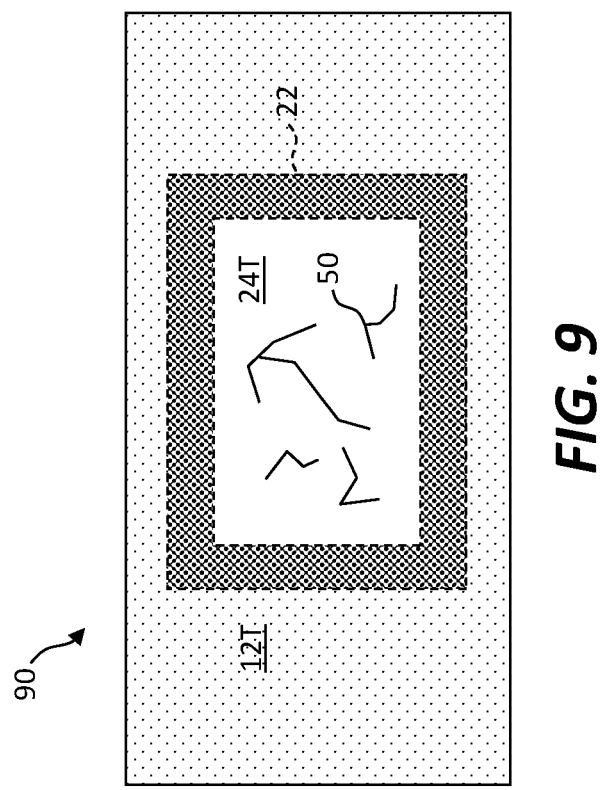
FIG. 9 is a plan view of a flexible electronic structure comprising a component with cracked component electrode connections and a flexible substrate according to illustrative embodiments of the present disclosure.

A planar electrical contact provides advantages over conventional electrical wire contacts because it can be more robust and less likely to fail under mechanical stress as flexible substrate 10 is flexed. As flexible substrate 10 flexes, there is no single stress point, unlike wire contacts that are substantially connected at a point of the wire contact between a relatively less flexible integrated circuit package and a more flexible substrate. As shown in FIG. 9, even if a portion of the planar contact cracks 50, electricity can still flow around cracks 50 in a vertical direction orthogonal to the plane of the planar contact and horizontally around cracks 50. Thus, in some embodiments, an area of component top electrode 24T has an area that is no less than 50% (e.g., no less than 60%, no less than 70%, no less than 80%, no less than 90% or no less than 100% of the area of the component substrate top side 22T. Similarly, an area of component bottom electrode 24B has an area that is no less than 50% (e.g., no less than 60%, no less than 70%, no less than 80%, no less than 90% or no less than 100% of the area of the component substrate bottom side 22B. Moreover, in some embodiments an area of top substrate layer 10T can be in electrical contact with substantially all of the area of component top electrode 24T and an area of bottom substrate layer 10B can be in electrical contact with substantially all of the area of component bottom electrode 24B. In order to prevent any electricity from flowing through the planar contact (e.g., between electrically conductive top substrate layer 10T and component top electrode 24T or between electrically conductive bottom substrate layer 10B and component bottom electrode 24B), an entire layer of conductors comprising the planar electrical contact would have to be ripped off. Given that the planar electrical contact can be laminated and then covered with a protective layer, separating the two layers of electrical conductors can be quite difficult. Thus, planar electrical contacts in embodiments of the present disclosure can be robust and maintain an electrical connection when mechanically stressed.

Figure 10B:
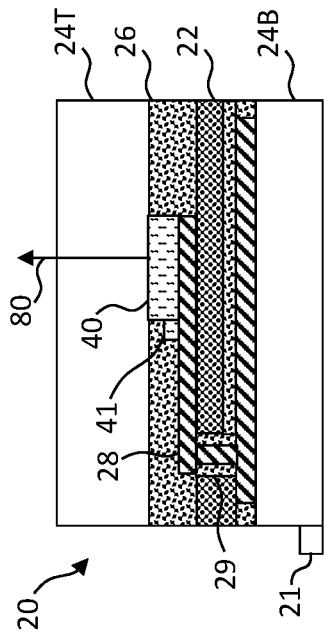
FIG. 10B is a cross section of a component comprising a vertical LED according to illustrative embodiments of the present disclosure.
Figure 10D:
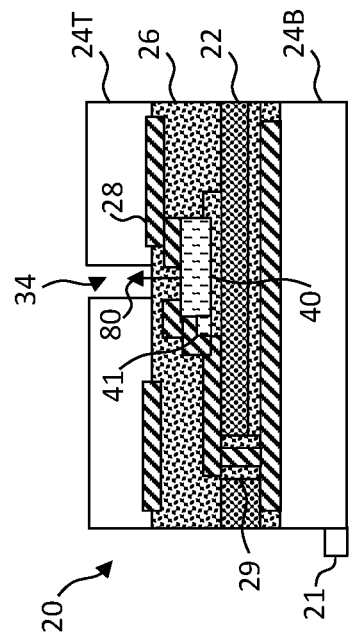
FIG. 10D is a cross section of a component comprising a horizontal LED and a hole for light emission through an opaque component top electrode according to illustrative embodiments of the present disclosure.
Figure 10A:
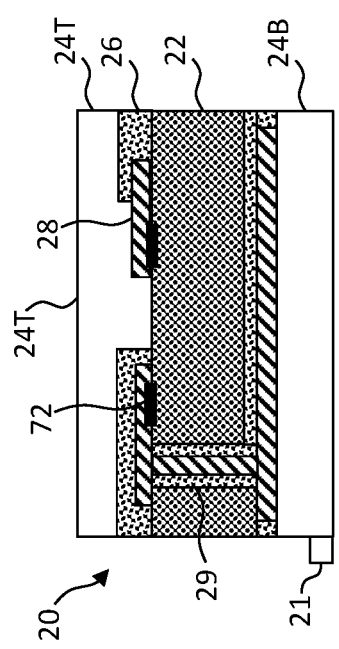
FIG. 10A is a cross section of a component according to illustrative embodiments of the present disclosure.
Figure 10C:
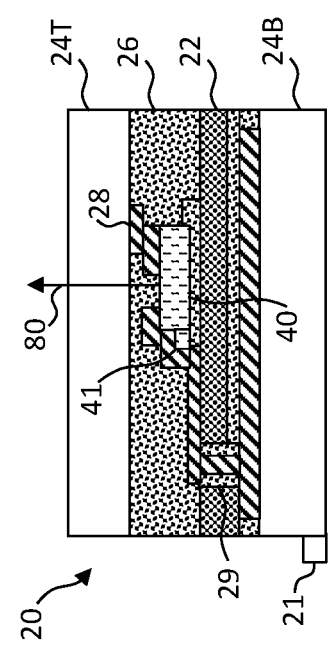
FIG. 10C is a cross section of a component comprising a horizontal LED according to illustrative embodiments of the present disclosure.

FIGS. 10A-10D illustrate various embodiments of component 20. As shown in FIG. 10A, a conductor (electrode) 28 electrically connects a contact pad 72 of integrated circuit 22 insulated by dielectric structures 26 to component top electrode 24T. A conductor (electrode) 28 also electrically connects a contact pad 72 of integrated circuit 22 to component bottom electrode 24B through a through-silicon via (TSV) 29. FIG. 10B illustrates component 20 comprising a vertical LED 40 on integrated circuit 22. Conductor 28 electrically connects to transparent or opaque component bottom electrode 24B through TSV 29 and LED 40 electrically connects to transparent component top electrode 24T to emit light 80 through transparent component top electrode 24T in response to electrical current. FIG. 10C illustrates component 20 comprising a horizontal LED 40 electrically connected to conductors 28 on integrated circuit 22. Conductors 28 electrically connect to transparent component top electrode 24T and to component bottom electrode 24B through TSV 29 to emit light 80 through transparent component top electrode 24T in response to electrical current. FIGS. 10A-10C use transparent component top electrodes 24T (for example polythiophene, indium tin oxide, or aluminum zinc oxide). FIG. 10D illustrates component 20 comprising a horizontal LED electrically connected to conductors 28 on integrated circuit 22. Conductors 28 electrically connect to component top electrode 24T and to component bottom electrode 24B through TSV 29 to emit light 80 in response to electrical current. Component top electrode 24T is not transparent, for example comprising a metal coating and hole 34 (or transparent fill 32) is provided for light 80 emitted by LED 40.

In some embodiments of the present disclosure, flexible substrate 10 generates electrical power, for example in response to mechanical stimulus such as pressing, squeezing, pinching, or other mechanical motion for example with a finger, fingers, or stylus. In some embodiments, electrically conductive top substrate layer 10T and electrically conductive bottom substrate layer 10B of flexible substrate 10 conduct electricity from a power generator 70, as shown in FIGS. 11A and 11B. A power generator 70 can comprise, for example, one or more photovoltaic or piezoelectric, or both photovoltaic and piezoelectric, power generating materials and/or one or more photovoltaic or piezoelectric, or both photovoltaic and piezoelectric, circuits. In some embodiments, power generator 70 is disposed on flexible substrate 10 and electrically connected, for example with contact pads 72 to electrically conductive top substrate layer 10T and electrically conductive bottom substrate layer 10B of flexible substrate 10, as shown in FIG. 11A. In some embodiments, power generator 70 is disposed between (e.g., at least partly or entirely between) electrically conductive top substrate layer 10T and electrically conductive bottom substrate layer 10B of flexible substrate 10, as shown in FIG. 11B, can comprise a component substrate 22, and component top and bottom electrodes 24T, 24B electrically connected to electrically conductive top substrate layer 10T and electrically conductive bottom substrate layer 10B, respectively, thereby defining planar electrical contacts. Thus, power generator 70 can be a type of component and the structures and methods discussed with respect to component 20 can be applied to power generator 70. Contact pads 72 can also be contact pads for generator 70. Multiple power generators 70 and components 20 can be provided in flexible electronic structure 90 and can be electrically connected in parallel.

FIG. 12A illustrates a flexible electrical structure 90 with spacer 30 and power generator 70 disposed between (e.g., at least partly or entirely between) top and bottom substrate layers 10T, 10B that are top substrate conductor layer 14T and bottom substrate layer 10B can comprise bottom substrate power-generating layer 12B and bottom substrate conductor layer 14B, respectively. When power generator 70 produces electrical power, the electrical current can be conducted with top substrate conductor layer 14T and bottom substrate conductor layer 14B to component 20.

FIG. 12B illustrates a flexible electrical structure 90 corresponding to FIGS. 5A-5C with spacer 30 and power generator 70 disposed between top and bottom substrate layers 10T, 10B. Top substrate layer 10T can comprise top substrate power-generating layer 12T and top substrate conductor layer 14T and bottom substrate layer 10B can comprise bottom substrate power-generating layer 12B and bottom substrate conductor layer 14B. When power generator 70 produces electrical power, the electrical current can be conducted with top substrate conductor layer 14T and bottom substrate conductor layer 14B to component 20. In some embodiments, therefore, flexible electrical structure can generate power with both top and bottom power-generating layers 12T, 12B and with power generator 70. Power generator 70 can be oriented to provide current with matching charges as top and bottom power-generating layers 12T, 12B.

Figure 12C:
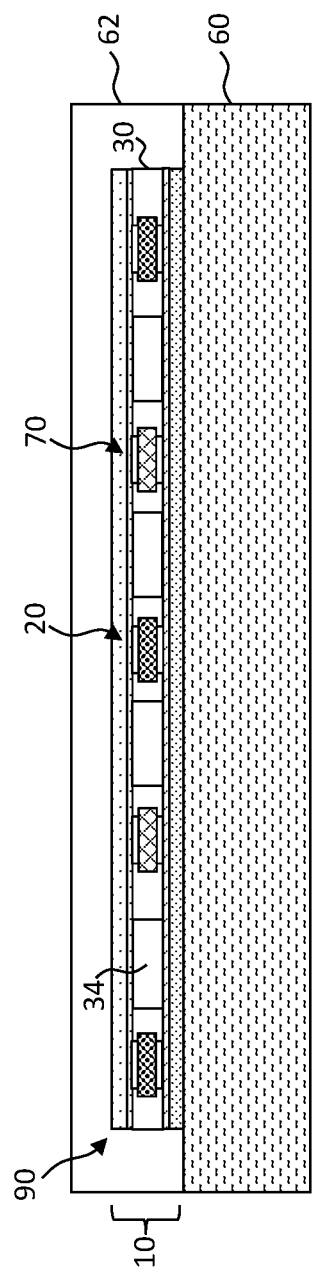
FIG. 12C is a plan view of a flexible electronic structure comprising multiple components and power generators and a flexible substrate according to illustrative embodiments of the present disclosure.

Embodiments of the present disclosure can comprise multiple power generators 70 and components 20 electrically connected in parallel with top and bottom substrate layers, as shown in FIG. 12C, with or without top and bottom power-generating layers 12T, 12B and holes 34 and in any of the configurations as described above.

Embodiments of the present disclosure can be constructed by disposing components 20 and generators 70, if included, onto bottom substrate layer 10B, for example by pick-and-place methods or micro-transfer printing and laminating top substrate layer 10T onto bottom substrate layer 10B and components 20 and generators 70 to form flexible electronic structure 90.

Embodiments of the present disclosure can be constructed by laminating bottom substrate power-generating layer 12B onto bottom substrate conductor layer 14B, disposing components 20 and generators 70, if included, onto bottom substrate power-generating layer 12B, for example by pick-and-place methods or micro-transfer printing, laminating top substrate power-generating layer 12T onto bottom substrate conductor layer 14B and components 20 and generators 70, and then laminating top substrate conductor layer 14T over top substrate power-generating layer 12T to form flexible electronic structure 90.

Embodiments of the present disclosure can be constructed by laminating bottom substrate conductor layer 14B onto bottom substrate power-generating layer 12B, disposing components 20 and generators 70, if included, onto bottom substrate conductor layer 14B, for example by pick-and-place methods or micro-transfer printing, laminating top substrate conductor layer 14T onto bottom substrate power-generating layer 12B and components 20 and generators 70, and then laminating top substrate power-generating layer 12T over top substrate conductor layer 14T to form flexible electronic structure 90.

In some embodiments, any multiple layers of bottom substrate layer 10B or top substrate layer 10T can be first constructed (e.g., by lamination) to form bottom substrate layer 10B or top substrate layer 10T and then the top and bottom substrate layers 10T, 10B combined with components 20 and generators 70, if present, to provide flexible electronic structure 90.

Component 20 can be a micro-component with one or more dimensions no greater than one mm. According to some embodiments of the present disclosure, component 20 can be micro-transfer printed from a component source wafer onto electrically conductive bottom substrate layer 10B and can comprise a broken (e.g., fractured) or separated component tether 21 in consequence of micro-transfer printing. Similarly, LED 40 can be micro-transfer printed from an LED source wafer onto component substrate 22 and can comprise a broken (e.g., fractured) or separated LED tether 41 in consequence of micro-transfer printing. In some embodiments, either or both component 20 and LED 40 are disposed onto bottom substrate layer 10B using pick-and-place techniques.

According to embodiments of the present disclosure, any one or combination of component 20, LED 40, and power generator 70 can be a microscopic structure with external dimensions less than two mm in length or width and a thickness no greater than 500 µm. For example, in some embodiments, component 20, LED 40, or power generator 70 can be a microscopic structure with external dimensions less than two mm in length or width (e.g., no greater than 1 mm, no greater than five hundred µm, no greater than three hundred µm, no greater than two hundred µm, no greater than one hundred µm, no greater than fifty µm, no greater than twenty µm, no greater than ten µm, or no greater than five µm) and a thickness no greater than five hundred µm (e.g., no greater than two hundred µm, no greater than one hundred µm, no greater than fifty µm, no greater than twenty µm, no greater than ten µm, no greater than five µm, or no greater than two µm).

Component 20, power generator 70, or LED 40 can be any structure useful in combination with flexible substrate 10, for example an active or passive electronic device. Component 20 can be an electrically responsive device and power generator 70 can be an electrically generating device such as a micro-electromechanical device. Component 20 or power generator 70 can be an electronic component 20, an opto-electronic component 20, can comprise electronic circuits or light-emitting devices such as light-emitting diodes 40, or can comprise any one or more of: piezoelectric material, photovoltaic material, and semiconductor material. Component 20, power generator 70, or LED 40 can comprise any one or more of a combination of a conductive metals (e.g., metals or electrically conductive polymers), dielectric materials, such as inorganic oxides (e.g., silicon oxide), nitrides (e.g., silicon nitride), or organic materials such as photoresists, resins, or epoxies. Component 20, power generator 70, or LED 40 can be constructed using photolithographic methods and materials known in the art. Component 20, power generator 70, or LED 40 can be coated or encapsulated, for example with an organic (e.g., a resin) or inorganic (e.g., an oxide or nitride) dielectric.

Reference is made in the present description to examples of micro-transfer printing (e.g., using a stamp with stamp posts) when describing certain examples of disposing LEDs 40, components 20, or power generators 70. Similar other embodiments are expressly contemplated using other transfer or printing devices. For example, in some embodiments, a transfer device that is a vacuum-based or electrostatic transfer device can be used. A vacuum-based or electrostatic transfer device can comprise a plurality of transfer posts, each transfer post being constructed and arranged to pick up a single device (similarly to stamp posts in a stamp).

According to some embodiments, micro-transfer printing can include any method of transferring component 20, power generator 70, or LED 40 from corresponding source wafers to flexible substrate 10 or component 20 by contacting them with a patterned or unpatterned stamp surface of a stamp to transfer them from their source wafer, transferring the stamp and contacted component 20, power generator 70, or LED 40 to flexible substrate 10 or component 20, and contacting them to a surface of flexible substrate 10 or component 20. Component 20, power generator 70, or LED 40 can be adhered to the stamp or flexible substrate 10 or component 20 by, for example, van der Waals forces, electrostatic forces, magnetic forces, chemical forces, adhesives, or any combination of the above, including separation-rate-dependent adhesion, for example kinetic control of viscoelastic stamp materials such as can be found in elastomeric transfer devices such as a PDMS stamp.

Any one or all of component 20, power generator 70, or LED 40 can be unpackaged dice (each an unpackaged die) transferred directly from a native source wafer on or in which they are constructed to flexible substrate 10 or component 20.

In certain embodiments, flexible substrate 10 is or comprises a member selected from the group consisting of polymer (e.g., plastic, polyimide, PEN, or PET), resin, metal foil, or flexible glass. In certain embodiments, flexible substrate 10 has a thickness from 5 µm to 20 mm (e.g., 5 to 10 µm, 10 to 50 µm, 50 to 100 µm, 100 to 200 µm, 200 to 500 µm, 500 µm to 0.5 mm, 0.5 to 1 mm, 1 mm to 5 mm, 5 mm to 10 mm, or 10 mm to 20 mm).

Examples of micro-transfer printing processes suitable for disposing components onto target substrates are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure-Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety. Examples of micro-transfer printed acoustic wave filter devices are described in U.S. patent application Ser. No. 15/047,250, entitled Micro-Transfer Printed Acoustic Wave Filter Device, the disclosure of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound micro-assembly structures and methods can also be used in certain embodiments, for example, as described in U.S. patent application Ser. No. 14/822,868, filed Aug. 10, 2015, entitled Compound Micro-Assembly Strategies and Devices, which is hereby also incorporated by reference in its entirety. In some embodiments, any one or more of components 20 or power generators 70 is a compound micro-assembled structure (e.g., a compound micro-assembled macro-system).

As is understood by those skilled in the art, the terms "over" and "under" and "top" and "bottom" are relative terms and can be interchanged in reference to different orientations of the layers, elements, and substrates included in various embodiments of the present disclosure. Further-more, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact).

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

Having described certain implementations of embodiments, it will now become apparent to one of skill in the art that other implementations incorporating the concepts of the disclosure may be used. The disclosure has been described in detail with particular reference to certain embodiments thereof, but it will be understood that variations and modifications can be effected within the spirit and scope of the following claims.

PARTS LIST

A cross section line
P pressure
10 flexible substrate
10B electrically conductive bottom substrate layer/bottom substrate layer
10T electrically conductive top substrate layer/top substrate layer
12B bottom substrate power-generating layer
12T top substrate power-generating layer
14B bottom substrate conductor layer
14T top substrate conductor layer
20 component
21 component tether
22 component substrate/integrated circuit
22B component substrate bottom side
22T component substrate top side
24B component bottom electrode
24T component top electrode
26 dielectric structure
28 conductor
29 through silicon via (TSV)
30 spacer
32 transparent fill
34 hole/transparent opening
40 light-emitting diode (LED)
41 LED tether
50 cracks
60 paper/document/banknote
62 laminated strip
70 power generator
72 contact pad
80 light
90 flexible electronic structure

What is claimed:

1. A flexible electronic structure, comprising:
a flexible substrate comprising an electrically conductive top substrate layer and an opposing electrically conductive bottom substrate layer; and
a component, comprising:
a component substrate non-native to the flexible substrate having a component substrate top side and an opposing component substrate bottom side;
a planar component top electrode disposed on the component substrate top side and electrically connected to the electrically conductive top substrate layer thereby defining a planar electrical contact; and
a planar component bottom electrode disposed on the component substrate bottom side and electrically connected to the electrically conductive bottom substrate layer thereby defining a planar electrical contact,
wherein the component is disposed between the electrically conductive top substrate layer and the electrically conductive bottom substrate layer, and
wherein the flexible substrate is a power-generating substrate.

2. The flexible electronic structure of claim 1, wherein the electrically conductive top substrate layer and the electrically conductive bottom substrate layer are or comprise triboelectric layers.

3. The flexible electronic structure of claim 2, wherein the electrically conductive top substrate layer comprises an electrically conductive top substrate conductive layer and a top substrate power-generating layer.

4. The flexible electronic structure of claim 3, wherein the top substrate conductive layer is on a side of the top substrate power-generating layer opposite the component.

5. The flexible electronic structure of claim 3, wherein the top substrate power-generating layer is on a side of the top substrate conductive layer opposite the component.

6. The flexible electronic structure of claim 2, wherein the electrically conductive bottom substrate layer comprises an electrically conductive bottom substrate conductive layer and a bottom substrate power-generating layer.

7. The flexible electronic structure of claim 6, wherein the bottom substrate conductive layer is on a side of the bottom substrate power-generating layer opposite the component.

8. The flexible electronic structure of claim 6, wherein the bottom substrate power-generating layer is on a side of the bottom substrate conductive layer opposite the component.

9. The flexible electronic structure of claim 1, wherein the flexible substrate comprises a spacer between the electrically conductive top substrate layer and the electrically conductive bottom substrate layer.

10. The flexible electronic structure of claim 9, wherein the spacer comprises holes where no spacer material is present.

11. The flexible electronic structure of claim 1, wherein the electrically conductive top substrate layer and the electrically conductive bottom substrate layer are a triboelectric power-generating pair.

12. The flexible electronic structure of claim 1, wherein the component is relatively rigid compared to the flexible substrate.

13. The flexible electronic structure of claim 1, wherein the component substrate comprises a crystalline semiconductor substrate.

14. The flexible electronic structure of claim 1, wherein the component has a thickness no greater than one hundred microns.

15. The flexible electronic structure of claim 1, wherein an area of the component top electrode has an area that is no less than 50% of an area of the component substrate top side.

16. The flexible electronic structure of claim 1, wherein an area of the component bottom electrode has an area that is no less than 50% of an area of the component substrate bottom side.

17. The flexible electronic structure of claim 1, wherein the component is an electronic or optoelectronic component.

18. The flexible electronic structure of claim 17, wherein the component comprises a light-emitting diode.

19. The flexible electronic structure of claim 18, wherein (i) the electrically conductive top substrate layer is transparent or comprises transparent openings through which the light-emitting diode can emit light, (ii) the electrically conductive bottom substrate layer is transparent or comprises openings through which the light-emitting diode can emit light, or (iii) both (i) and (ii).

* * * * *